(12) United States Patent
Nutt

(10) Patent No.: US 6,172,508 B1
(45) Date of Patent: Jan. 9, 2001

(54) SYSTEM FOR TESTING TRACTOR AND TRAILER LIGHT SYSTEMS

(76) Inventor: Philip J. Nutt, 213 Petticoat Bridge Rd., Columbus, NJ (US) 08022

(*) Notice: Under 35 U.S.C. 154(b), the term of this patent shall be extended for 0 days.

(21) Appl. No.: 09/253,300

(22) Filed: Feb. 19, 1999

(51) Int. Cl.[7] .................................................. G01R 31/02
(52) U.S. Cl. ........................ 324/504; 324/503; 324/556
(58) Field of Search ................................ 324/503, 504, 324/556

(56) References Cited

U.S. PATENT DOCUMENTS 4,884,032 * 11/1989 LaPensee ............................ 324/504
5,416,421 * 5/1995 Doland et al. ...................... 324/504

* cited by examiner

Primary Examiner—Safet Metjahic
Assistant Examiner—Vincent Q. Nguyen

(57) ABSTRACT

A new and improved system for testing tractor and trailer light systems interconnected by a cable wherein the trailer has a gladhand. The system includes a housing having a front control panel, a pair of battery terminals connected to said housing for connecting it to a battery and a cable connected to the housing having a connector which can be connected to an electrical receptacle of a trailer. Further, a plurality of switches are connected to the battery and the connector for testing various electrical circuits in the trailer. Additionally, a support rod is provided for engaging a convention glad hand thereby supporting the device in a hands free manner when in use.

7 Claims, 2 Drawing Sheets

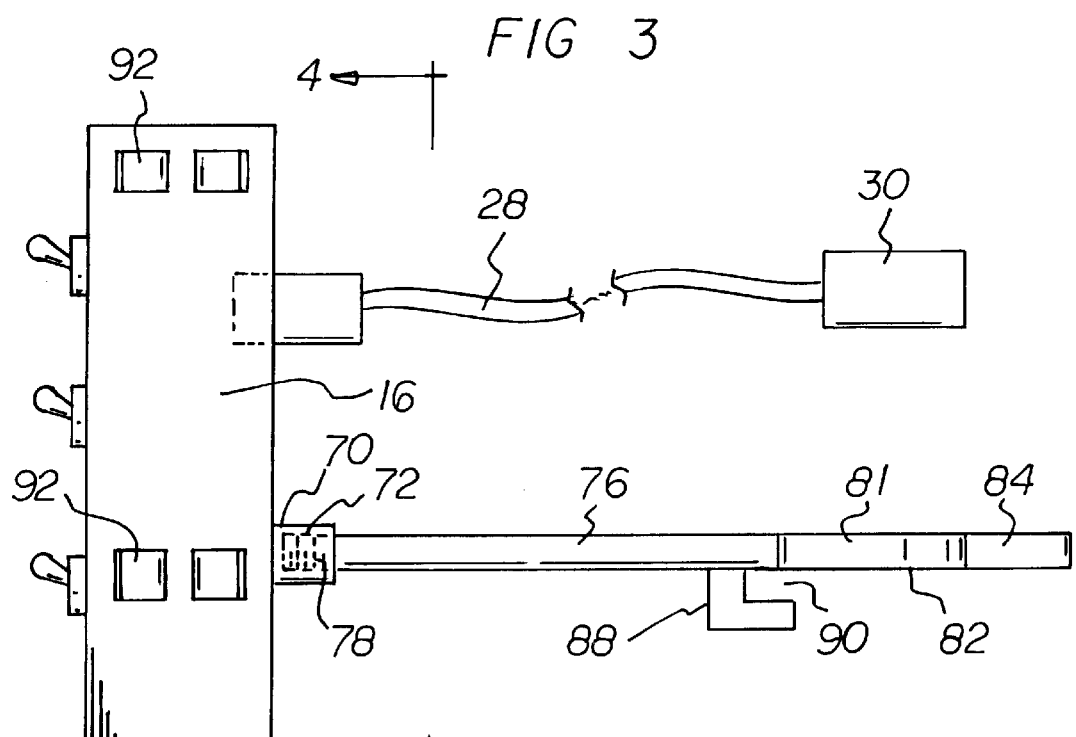
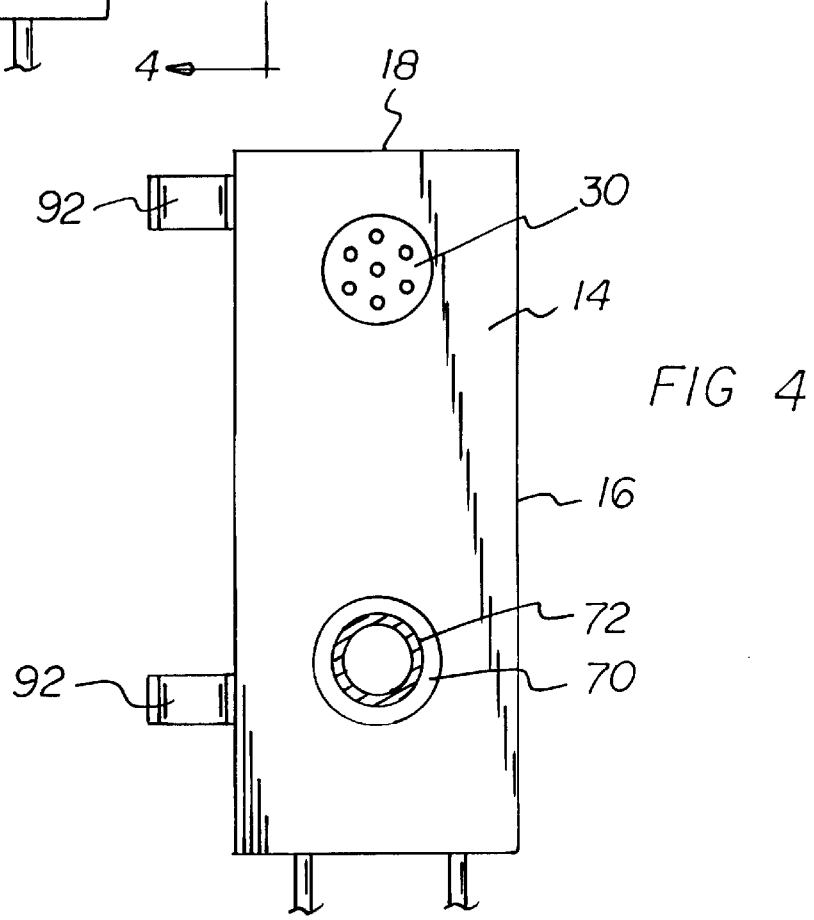

SYSTEM FOR TESTING TRACTOR AND TRAILER LIGHT SYSTEMS

BACKGROUND OF THE INVENTION

1. Field of the Invention

The present invention relates to a system for testing trailer light systems and more particularly pertains to testing the lights of a trailer whereby the device is supported in a hands free manner.

2. Description of the Prior Art

The use of trailer light tester systems of known designs and configurations is known in the prior art. More specifically, tractor/trailer light tester systems of known designs and configurations heretofore devised and utilized for the purpose of testing tractor/trailer light systems through known methods and apparatuses are known to consist basically of familiar, expected, and obvious configurations, notwithstanding the myriad of designs encompassed by the crowded prior art which has been developed for the fulfillment of countless objectives and requirements.

By way of example, U.S. Pat. No. 4,547,722 to Sarlo discloses a Test Panel For Tractor And trailer Lights. U.S. Pat. No. 4,884,032 to LaPensee discloses an Trailer/Tractor Light System. U.S. Pat. No. 5,416,421to Doland, Sr. et al. discloses a trailer Lamp Testing and Lamp Storage Apparatus. U.S. Pat. No. 5,086,277 to Hammerly discloses an Apparatus And Method For Performing Diagnostic Tests on The Electrical Systems Of Recreational Vehicles And The Like. U.S. Pat. No. 3,737,767 to Slutsky discloses an Trailer Testing System. Lastly, U.S. Pat. No. 3,663,939 to Olsson discloses an Combination Test Box And Battery Charger.

While these devices fulfill their respective, particular objectives and requirements, the aforementioned patents do not describe system for testing trailer light systems as disclosed herein.

In this respect, the system for testing trailer light systems according to the present invention substantially departs from the conventional concepts and designs of the prior art, and in doing so provides an apparatus primarily developed for the purpose of testing the lights of a trailer while the testing device is supportable from the glad hand normally associated with a trailer.

Therefore, it can be appreciated that there exists a continuing need for a system for testing trailer light systems which can be used for system for testing trailer light systems for testing the lights of a trailer while the testing device is supportable from the glad hand normally associated with a trailer. In this regard, the present invention substantially fulfills this need.

SUMMARY OF THE INVENTION

In view of the foregoing disadvantages inherent in the known types of system for testing trailer light systems of known designs and configurations now present in the prior art, the present invention provides an improved system for testing trailer light systems. As such, the general purpose of the present invention, which will be described subsequently in greater detail, is to provide a new and improved system for testing trailer light systems and method which has all the advantages of the prior art and none of the disadvantages.

To attain this, the present invention essentially comprises a new and improved system for testing trailer light systems interconnected by a cable wherein the trailer has a gladhand. The system includes a housing having a front control panel, a pair of battery terminals connected to said housing for connecting it to a battery and a cable connected to the housing having a connector which can be connected to an electrical receptacle of a trailer. Further, a plurality of switches are connected to the battery and the connector for testing various electrical circuits in the trailer. Additionally, a support rod is provided for engaging a convention glad hand thereby supporting the device in a hands free manner when in use.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a system for testing trailer light systems which has all of the advantages of the prior systems for testing trailer light systems of known designs and configurations and none of the disadvantages.

It is another object of the present invention to provide a new and improved system for trailer light systems which may be easily and efficiently manufactured and marketed.

It is further object of the present invention to provide a new and improved system for trailer light systems which is of durable and reliable constructions.

An even further object of the present invention is to provide a new and improved light testing system which is susceptible of a low cost of manufacture with regard to both materials and labor, and which accordingly is then susceptible of low prices of sale to the consuming public, thereby making such system for testing trailer light systems economically available to the buying public.

Lastly, it is an object of the present invention to provide a new and improved system for testing trailer light systems interconnected by a cable wherein the trailer has a gladhand whereby the system includes a housing having a front control panel, a pair of battery terminals, and a cable connected to the housing having a connector which can be connected to an electrical receptacle of a trailer whereby a support rod is provided for engaging a convention glad hand thereby supporting the device in a hands free manner when in use.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is a side elevational view of the present invention.

FIG. 4 is a rear elevational view of the present invention.

The same reference numerals refer to the same parts through the various Figures.

DESCRIPTION OF THE PREFERRED EMBODIMENT

Figure 1:
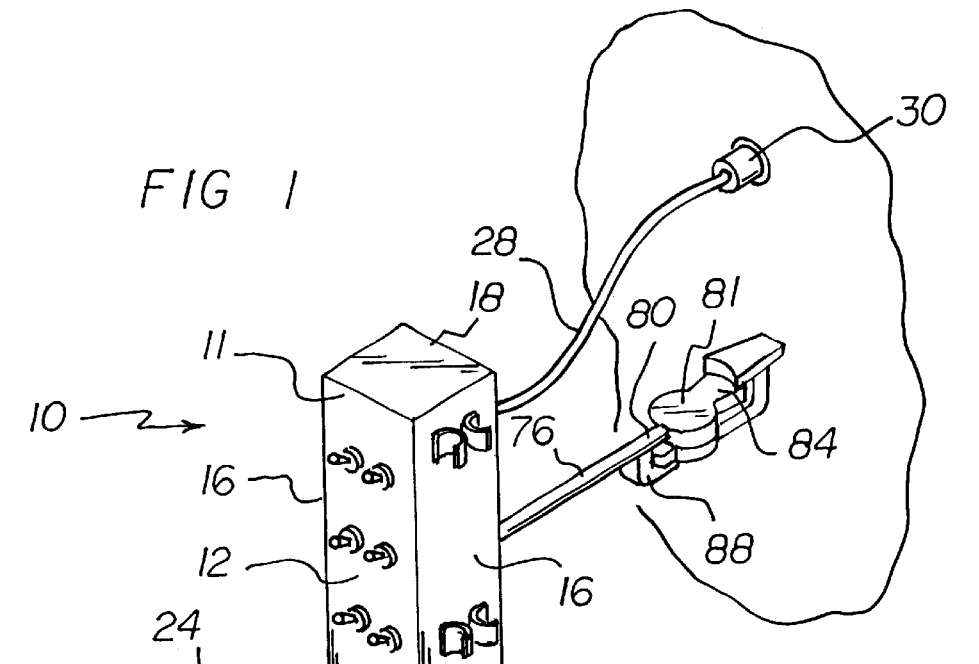
FIG 1 is a perspective view of the preferred embodiment of the system for testing trailer light systems constructed in accordance with the principles of the present invention.
Figure 2:
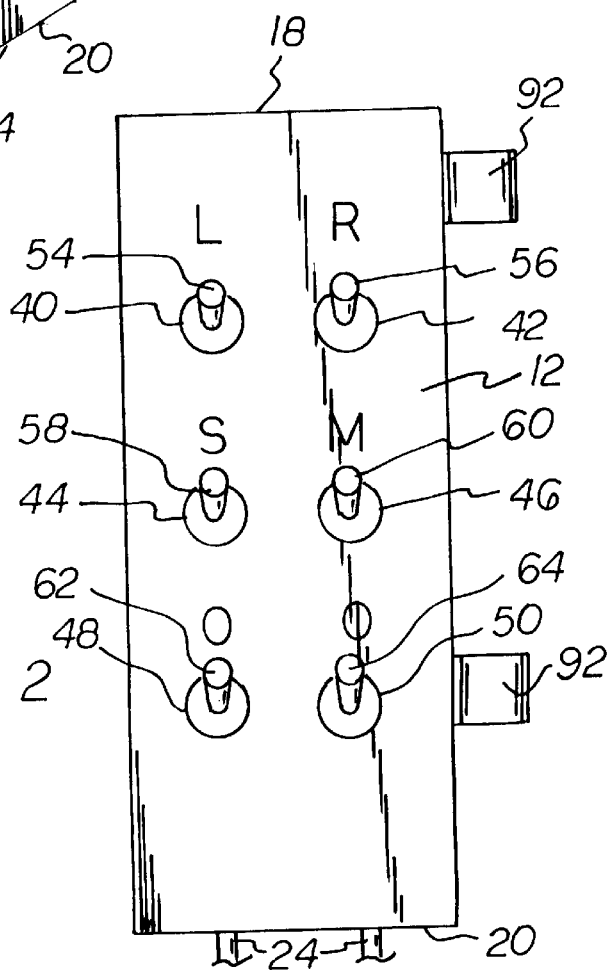
FIG. 2 is a front elevational view of the present invention.

With reference now to the drawings, and in particular to FIG. 1 thereof, the preferred embodiment of the new and improved system for testing trailer light systems embodying the principles and concepts of the present invention and generally designated by the reference numeral 10 will be described.

The present invention, the system for testing trailer light systems 10 is comprised of a plurality of components. Such components in their broadest context include a housing having a front control panel, a pair of battery teriminals, a cable connected to the housing having a connector which can be connected to an electrical receptacle of a trailer, a plurality of switches for testing various electrical circuits in the trailer, and a support rod for engaging a conventional glad hand thereby supporting the device in a hands free manner when in use. Such components are individually configured and correlated with respect to each other so as to attain the desired objective.

As disclosed herein, the new and improved system for trailer light systems is for use with tractor trailer rigs interconnected by a cable. Further the tractor and trailer rigs normally have a gladhand connection associated therewith. Conventional gladhands have an upper surface, a tab receiving recess and a protruding tongue.

The present invention includes a housing 11. The housing in generally box shaped and includes a front control panel 12, a rear support panel 14, a pair of sidewalls 16 and a top 18 and bottom 20. The housing contains the various electrical circuitry and control means associated with the invention.

Further, a pair of battery terminals 24 extend from and are connected to the housing for connecting it to a battery thereby providing power to the trailer lights to be tested. Preferably, the terminals are alligator type clips. Additionally, a cable 28 is connected to the housing. The cable has a connector 30 which can be connected to an electrical receptacle of a trailer for providing means for operationally coupling the device to the trailer lights to be tested.

The housing contains a plurality of switches. The plurality of switches are operably connected to the battery and the connector to thereby test various electrical circuits in the trailer. When a switch is switched to the on position, if the trailer light that it corresponds is operational, the switch will light up via a test indicator. Switch 40 corresponds to the trailer left turn signal. Switch 42 corresponds to the trailer right turn signal. Switch 44 corresponds to the trailer stop lights. Switch 46 corresponds to the trailer marker lights. Switch 48 corresponds to the trailer utility lights. Switch 50 corresponds to the trailer auxiliary lights. Preferably, the plurality of switches have transparent actuators.

Further, the switches each contain the test indicators, a plurality of test indicators 54, 56, 58, 60, 62, 64 are associated with the plurality of switches 40, 42, 44, 46, 48, 50 to indicate when the switches are on. Preferably, test indicators are electrical lights and are mounted in the actuators;

The housing further includes a socket 70. The socket is connected to the rear support panel of the housing and has an axial bore containing a threaded recess 72 a support rod 76 is further provided. The rod has a threaded first end 78 for engaging the threaded recess of the socket and a glad hand engaging second end 80. The second end has a central body 81 with a lower surface 82 for mating with the upper surface of a conventional glad hand. Further, central body has a fan shaped tab 84 extending outwardly from the body. The tab is inserted into and engages the tab receiving recess of a glad hand. Additionally, a clip adjacent 88 is formed at the second end of the rod at a position adjacent the central body. The clip extends downwardly from the rod and outwardly therefrom toward the central body. The clip includes a tongue receiving slot 90 for receiving the tongue of the glad hand. In use the central body of the present invention is placed over a gladhand associated with a trailer having its lights tested and rotated such that the lower surface of the central body, the fan shaped tab and clip engage the gladhand and are secured thereto. This arrangement provides a means for presenting the housing to a user in a hands free manner.

Finally, the present invention includes a pair of clips 92. The clips are mounted to the sidewall of the housing in axial alignment with each another in a spaced configuration. The clips receive the support rod therebetween when the rod is in a stored position. When the present invention is not in use, the support rod may be unscrewed from the socket and secured by the clips.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. a new and improved system for testing tractor and trailer light systems interconnected by a cable wherein the trailer has a gladhand connection having upper surface, a tab receiving recess and a protruding tongue, comprising in combination:

a housing having a front control panel, a rear support panel a pair of sidewalls and a top and bottom;

a pair of battery terminals connected to said housing for connecting it to a battery;

a cable connected to the housing, the cable having a connector which can be connected to an electrical receptacle of a trailer;

a plurality of switches connected to the battery and the connector for testing various electrical circuits in the trailer, wherein said plurality of switches have transparent actuators;

a plurality of test indicators associated with the plurality of switches to indicate when the switches are on, wherein the plurality of test indicators are electrical lights;

wherein the plurality of test indicators are mounted in the actuators;

wherein the switches each contain the test indicators;

a socket connected to the rear support panel of the housing, the socket having a threaded recess;

a support rod having a threaded first end for engaging the threaded recess of the socket and a glad hand engaging second end, the second end having a central body having a lower surface for mating with the upper surface of a glad hand, a fan shaped tab extending outwardly from the body for insertion into the tab receiving recess of the glad hand and a clip adjacent the second end of the rod and extending downwardly and outwardly from the rod, the tab having a tongue receiving slot for receiving the tongue of the glad hand; and a pair of clips mounted to the sidewall of the housing for receiving the support rod therebetween when the rod is in a stored position.

2. a new and improved system for testing tractor and trailer light systems interconnected by a cable wherein the trailer has a gladhand connection having upper surface, a tab receiving recess and a protruding tongue, comprising in combination:

a housing;

a pair of battery terminals connected to said housing;

a cable connected to the housing, the cable having a connector which can be connected to an electrical receptacle of a trailer;

a plurality of switches connected to the battery terminal and the connector;

a plurality of test indicators associated with the plurality of switches;

a socket connected to the rear support panel of the housing; and a support rod having a first end for engaging the socket and a glad hand engaging second end.

3. The new and improved system for testing tractor and trailer light systems of claim 2 and further including:

a pair of clips mounted to the sidewall of the housing for receiving the support rod therebetween when the rod is in a stored position.

4. The new and improved system for testing tractor and trailer light systems of claim 2 wherein the glad hand engaging second end comprises a central body having a lower surface for mating with the upper surface of a glad hand, a fan shaped tab extending outwardly from the body for insertion into the tab receiving recess of the glad hand and a clip adjacent the second end of the rod and extending downwardly and outwardly from the rod, the tab having a tongue receiving slot for receiving the tongue of the glad hand.

5. The new and improved system for testing tractor and trailer light systems of claim 2 wherein the a housing has a front control panel, a rear support panel a pair of sidewalls and a top and bottom.

6. The new and improved system for testing tractor and trailer light systems of claim 2 wherein the plurality of switches have transparent actuators.

7. The new and improved system for testing tractor and trailer light systems of claim 2 wherein the plurality of test indicators are electrical lights and are mounted in the actuators.

* * * * *